(12) United States Patent
Kono (10) Patent No.: US 11,955,543 B2
(45) Date of Patent: Apr. 9, 2024

(54) SEMICONDUCTOR DEVICE (71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 397 days.

(21) Appl. No.: 17/471,093

(22) Filed: Sep. 9, 2021

(65) Prior Publication Data

US 2022/0271155 A1 Aug. 25, 2022

(30) Foreign Application Priority Data

Feb. 25, 2021 (JP) .................. 2021-029016

(51) Int. Cl.
 *H01L 29/78* (2006.01)
 *H01L 29/06* (2006.01)
 *H01L 29/10* (2006.01)
 *H01L 29/16* (2006.01)

(52) U.S. Cl.
 CPC ........ *H01L 29/7806* (2013.01); *H01L 29/063* (2013.01); *H01L 29/1095* (2013.01); *H01L 29/1608* (2013.01)

(58) Field of Classification Search
 CPC ......... H01L 21/02378; H01L 21/02529; H01L 21/02634; H01L 21/8213; H01L 21/82385; H01L 24/32; H01L 27/0207; H01L 27/092; H01L 27/0922; H01L 29/063; H01L 29/0847; H01L 29/1095; H01L 29/1087;
 (Continued)

(56) References Cited

U.S. PATENT DOCUMENTS 9,577,086 B2 2/2017 Hino et al.
9,887,285 B1 2/2018 Oota et al.
(Continued)

FOREIGN PATENT DOCUMENTS

JP 2018049951 A 3/2018
JP 2020047683 A 3/2020
(Continued)

*Primary Examiner* — Brook Kebede
(74) *Attorney, Agent, or Firm* — Kim & Stewart LLP (57) ABSTRACT

A semiconductor device of embodiments includes: a first electrode; a second electrode; a gate electrode extending in a first direction; a silicon carbide layer between the first electrode and the second electrode and including a first silicon carbide region of a first conductive type having a first region facing the gate electrode and a second region in contact with the first electrode, a second silicon carbide region of a second conductive type, and a third silicon carbide region of a second conductive type, the first region being interposed between the second silicon carbide region and the third silicon carbide region. A first width of the first region in a second direction perpendicular to the first direction is 0.5 µm or more than and 1.2 µm or less. A second width of the second region in the second direction 0.5 µm or more than and 1.5 µm or less.

9 Claims, 9 Drawing Sheets

(58) Field of Classification Search
CPC ............... H01L 29/1608; H01L 29/36; H01L 29/41758; H01L 29/66068; H01L 29/7806
See application file for complete search history.

(56) References Cited

U.S. PATENT DOCUMENTS

| | | | |
|---|---|---|---|
| 2017/0236935 A1* | 8/2017 | Ebihara | ............... H01L 29/7815 257/77 |
| 2017/0345903 A1* | 11/2017 | Shimizu | ................ B60L 15/007 |
| 2019/0198656 A1* | 6/2019 | Zhang | ................ H01L 29/0696 |
| 2019/0319103 A1* | 10/2019 | Masunaga | ........... H01L 29/1095 |
| 2020/0091295 A1 | 3/2020 | Ohashi et al. | |
| 2020/0279940 A1 | 9/2020 | Kono et al. | |
| 2021/0083094 A1 | 3/2021 | Sakaguchi et al. | |

FOREIGN PATENT DOCUMENTS

| | | |
|---|---|---|
| JP | 2020141113 A | 9/2020 |
| WO | 2014162969 A1 | 10/2014 |
| WO | 2018139556 A1 | 8/2018 |

* cited by examiner

SEMICONDUCTOR DEVICE

CROSS-REFERENCE TO RELATED APPLICATION

This application is based upon and claims the benefit of priority from Japanese Patent Application No. 2021-029016, filed on Feb. 25, 2021, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of 3 times that of silicon, a breakdown field strength of about 10 times that of silicon, and a thermal conductivity of about 3 times that of silicon. By using such characteristics, for example, it is possible to realize a metal oxide semiconductor field effect transistor (MOSFET) that has a high breakdown voltage and low loss and that can operate at high temperature.

A vertical MOSFET using silicon carbide has a pn junction diode as a built-in diode. For example, a MOSFET is used as a switching element connected to an inductive load. In this case, even when the MOSFET is in the off state, a reflux current can be made to flow by using a pn junction diode.

However, when a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a decrease in the reliability of the MOSFET. For example, by providing a Schottky barrier diode (SBD) operating in a unipolar manner in the MOSFET as a built-in diode, it is possible to suppress the growth of a stacking fault in the silicon carbide layer.

When the MOSFET is in the on state, the load connected to the MOSFET may fail and the load resistance may decrease. In this case, the MOSFET is short-circuited and a large current flows through the MOSFET. The time from when the MOSFET is short-circuited to when the MOSFET is damaged is referred to as short-circuit tolerance. Even in a MOSFET in which the SBD is provided, it is desired to improve the short-circuit tolerance of the MOSFET from the viewpoint of improving reliability.

DETAILED DESCRIPTION

A semiconductor device of embodiments includes: a first electrode; a second electrode; a gate electrode extending in a first direction; a silicon carbide layer provided between the first electrode and the second electrode and having a first face parallel to the first direction on a side of the first electrode and a second face on a side of the second electrode, the silicon carbide layer including: a first silicon carbide region of a first conductive type including a first region and a second region, the first region being in contact with the first face, the first region facing the gate electrode, the first region extending in the first direction, the second region being in contact with the first face and in contact with the first electrode; a second silicon carbide region of a second conductive type provided between the first silicon carbide region and the first face, the second silicon carbide region facing the gate electrode, and electrically connected to the first electrode, at least a part of the second silicon carbide region being interposed between the first region and the second region; a third silicon carbide region of the second conductive type provided between the first silicon carbide region and the first face, the third silicon carbide region facing the gate electrode, and electrically connected to the first electrode, the first region being interposed between the second silicon carbide region and the third silicon carbide region; and a fourth silicon carbide region of the first conductive type provided between the second silicon carbide region and the first face and electrically connected to the first electrode; and a gate insulating layer provided between the gate electrode and the second silicon carbide region, between the gate electrode and the third silicon carbide region, and between the gate electrode and the first region, wherein a first width of the first region in a second direction perpendicular to the first direction is equal to or more than 0.5 μm and equal to or less than 1.2 μm, a second width of the second region in the second direction is equal to or more than 0.5 μm and equal to or less than 1.5 μm. And a shortest distance between a first line segment and a second line segment is equal to or more than three times the first width, the first line segment being on a first center line extending in the first direction through a first midpoint of the first region in the second direction on the first face, the first line segment being disposed in the second direction with respect to a portion where the fourth silicon carbide region and the first electrode are in contact with each other, the second line segment being on a second center line extending in the first direction through a second midpoint of the second region in the second direction on the first face, the second line segment overlapping the second region.

Hereinafter, embodiments will be described with reference to the diagrams. In the following description, the same or similar members and the like are denoted by the same reference numerals, and the description of the members and the like once described may be omitted as appropriate.

In addition, in the following description, when there are notations of $n^+$, $n$, $n^-$, $p^+$, $p$, and $p^-$, these notations indicate the relative high and low of the impurity concentration in each conductive type. That is, n$^+$ indicates that the n-type impurity concentration is relatively higher than n, and n$^-$ indicates that the n-type impurity concentration is relatively lower than n. In addition, p$^+$ indicates that the p-type impurity concentration is relatively higher than p, and p$^-$ indicates that the p-type impurity concentration is relatively lower than p. In addition, n$^+$-type and n$^-$-type may be simply described as n-type, p$^+$-type and p$^-$-type may be simply described as p-type.

In addition, unless otherwise specified in this specification, the "impurity concentration" means a concentration when the impurity concentration of the opposite conductive type is compensated for. That is, the n-type impurity concentration in an n-type silicon carbide region means a concentration obtained by subtracting the concentration of p-type impurities from the concentration of n-type impurities. In addition, the p-type impurity concentration in a p-type silicon carbide region means a concentration obtained by subtracting the concentration of n-type impurities from the concentration of p-type impurities.

In addition, unless otherwise specified in this specification, the "impurity concentration in the silicon carbide region" is a maximum impurity concentration in the corresponding silicon carbide region.

The impurity concentration can be measured by, for example, time of flight-secondary ion mass spectrometry (TOF-SIMS). In addition, the relative high and low of the impurity concentration can be determined from, for example, the high and low of the carrier concentration obtained by scanning capacitance microscopy (SCM). In addition, the distance such as the depth and thickness of an impurity region can be calculated by, for example, TOF-SIMS. In addition, the distance such as the depth, thickness, and width of an impurity region and a distance between impurity regions can be calculated from, for example, a composite image of an SCM image and an atomic force microscope (AFM) image.

First Embodiment

Figure 1:
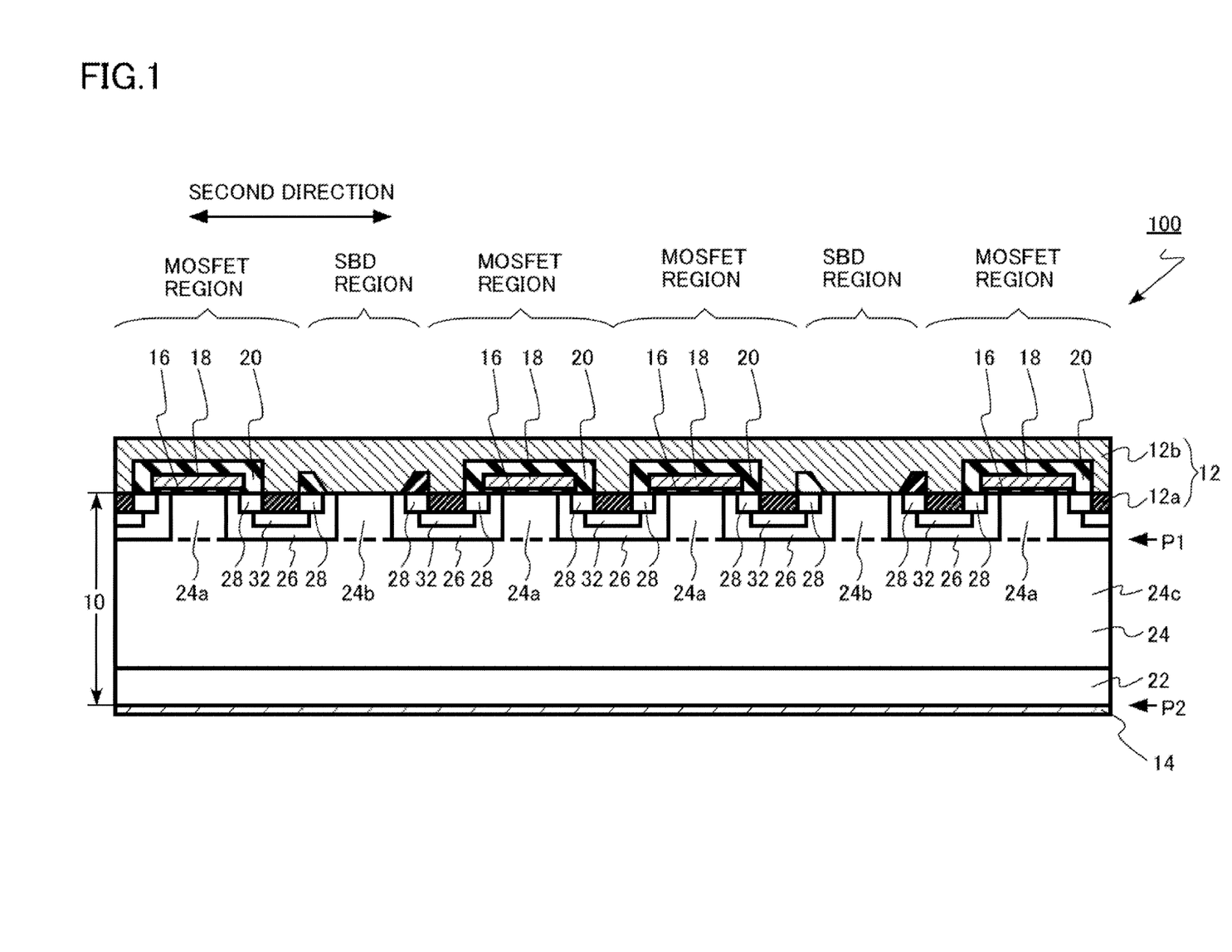
FIG. 1 is a schematic cross-sectional view of a semiconductor device of a first embodiment.
Figure 2:
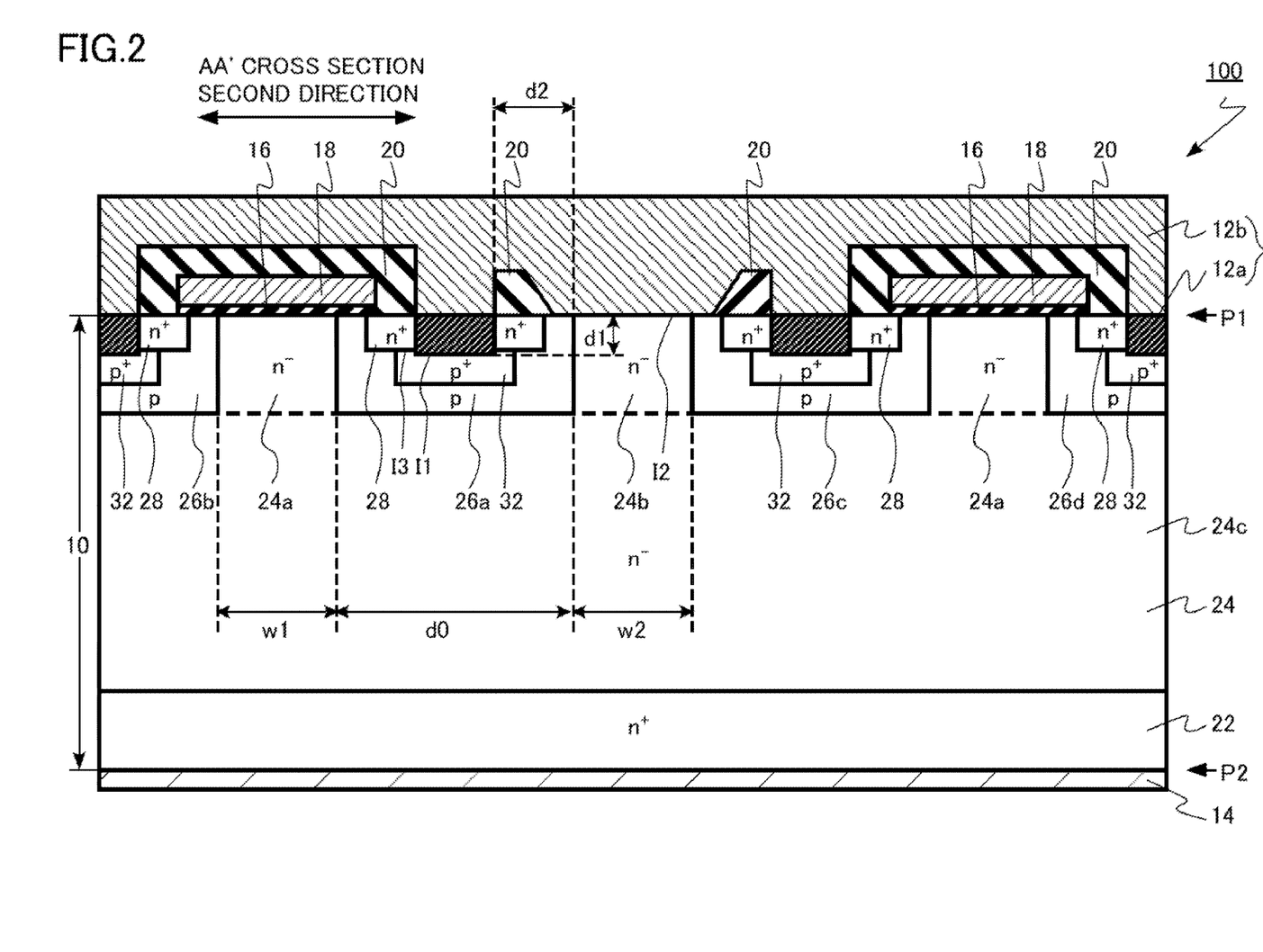
FIG. 2 is a schematic cross-sectional view of the semiconductor device of the first embodiment.
Figure 3:
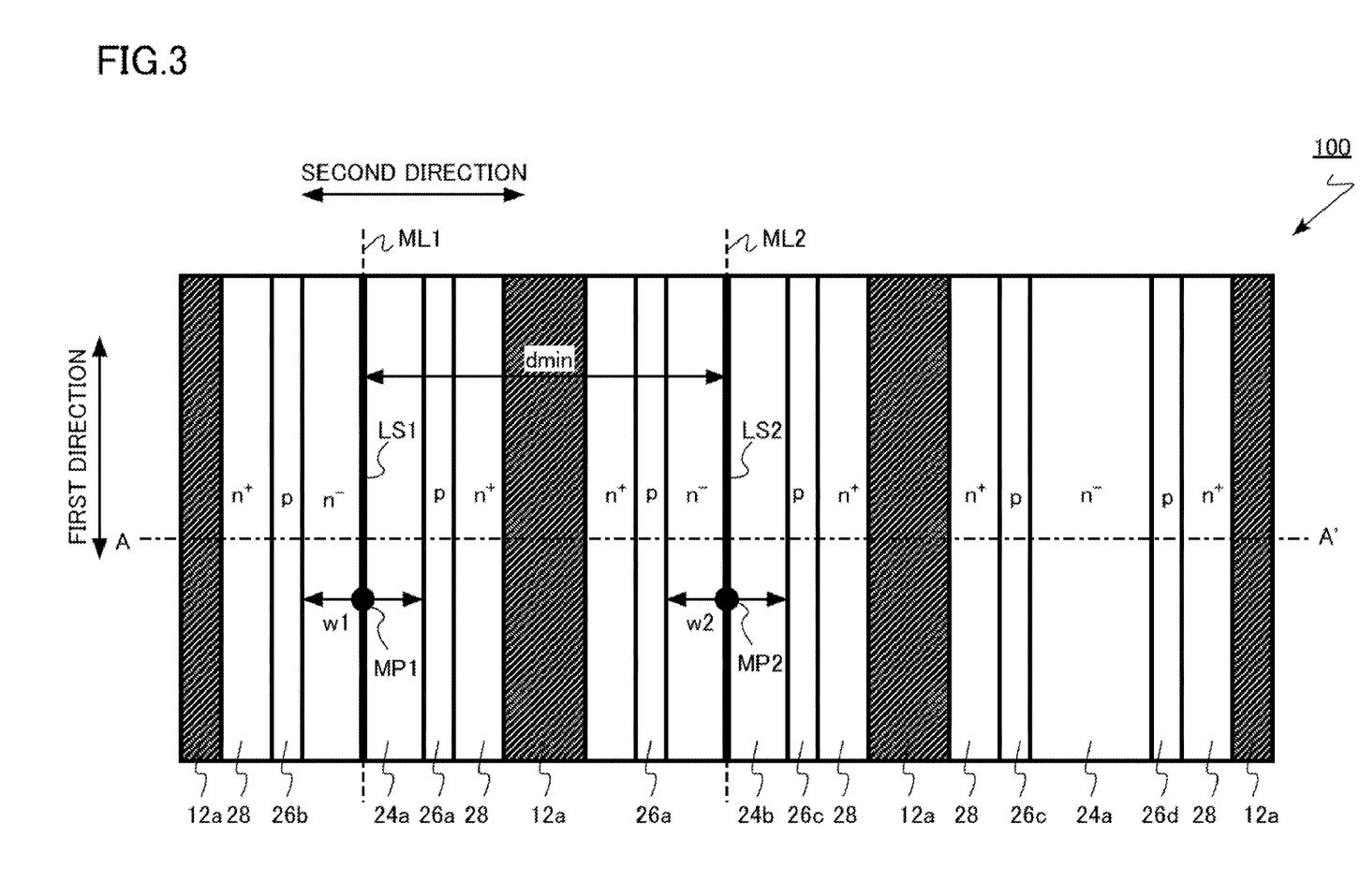
FIG. 3 is a schematic top view of the semiconductor device of the first embodiment.

A semiconductor device of a first embodiment includes: a first electrode; a second electrode; a gate electrode extending in a first direction; a silicon carbide layer provided between the first electrode and the second electrode and having a first face parallel to the first direction on a side of the first electrode and a second face on a side of the second electrode, the silicon carbide layer including: a first silicon carbide region of a first conductive type including a first region and a second region, the first region being in contact with the first face, the first region facing the gate electrode, the first region extending in the first direction, the second region being in contact with the first face and in contact with the first electrode; a second silicon carbide region of a second conductive type provided between the first silicon carbide region and the first face, the second silicon carbide region facing the gate electrode, and electrically connected to the first electrode, at least a part of the second silicon carbide region being interposed between the first region and the second region; a third silicon carbide region of the second conductive type provided between the first silicon carbide region and the first face, the third silicon carbide region facing the gate electrode, and electrically connected to the first electrode, the first region being interposed between the second silicon carbide region and the third silicon carbide region; and a fourth silicon carbide region of the first conductive type provided between the second silicon carbide region and the first face and electrically connected to the first electrode; and a gate insulating layer provided between the gate electrode and the second silicon carbide region, between the gate electrode and the third silicon carbide region, and between the gate electrode and the first region. And a first width of the first region in a second direction perpendicular to the first direction is equal to or more than 0.5 μm and equal to or less than 1.2 μm, a second width of the second region in the second direction is equal to or more than 0.5 μm and equal to or less than 1.5 μm, and a shortest distance between a first line segment and a second line segment is equal to or more than three times the first width, the first line segment being on a first center line extending in the first direction through a first midpoint of the first region in the second direction on the first face, the first line segment being disposed in the second direction with respect to a portion where the fourth silicon carbide region and the first electrode are in contact with each other, the second line segment being on a second center line extending in the first direction through a second midpoint of the second region in the second direction on the first face, the second line segment overlapping the second region FIG. 1 is a schematic cross-sectional view of the semiconductor device of the first embodiment. FIG. 2 is a schematic cross-sectional view of the semiconductor device of the first embodiment. FIG. 2 is an enlarged view of a part of FIG. 1. FIG. 3 is a schematic top view of the semiconductor device of the first embodiment. FIG. 3 is a diagram showing a silicon carbide region and a pattern of electrodes on the surface of a silicon carbide layer. FIG. 2 is a cross-sectional view taken along the line AA' of FIG. 3.

The semiconductor device of the first embodiment is a planar gate type vertical MOSFET 100 using silicon carbide. The MOSFET 100 of the first embodiment is, for example, a double implantation MOSFET (DIMOSFET) in which a body region and a source region are formed by ion implantation. In addition, the semiconductor device of the first embodiment includes an SBD as a built-in diode.

Hereinafter, a case where the first conductive type is n type and the second conductive type is p type will be described as an example. The MOSFET 100 is a vertical re-channel MOSFET having electrons as carriers.

The MOSFET 100 includes a silicon carbide layer 10, a source electrode 12 (first electrode), a drain electrode 14 (second electrode), a gate insulating layer 16, a gate electrode 18, and an interlayer insulating layer 20. The MOSFET 100 includes a plurality of MOSFET regions and a plurality of SBD regions.

The silicon carbide layer 10 includes an n$^+$-type drain region 22, an n$^-$-type drift region 24 (first silicon carbide region), a p-type body region 26, an n$^+$-type source region 28 (fourth silicon carbide region), and a p$^+$-type body contact region 32 (fifth silicon carbide region). The p-type body region 26 includes a first body region of p-type 26a (second silicon carbide region), a second body region of p-type 26b (third silicon carbide region), a third body region of p-type 26c (sixth silicon carbide region), and a fourth body region of p-type 26d.

The drift region 24 has a JFET region 24a (first region), a JBS region 24b (second region), and a lower region 24c.

The source electrode 12 is an example of the first electrode. The drain electrode 14 is an example of the second electrode. The drift region 24 is an example of the first silicon carbide region. The first body region 26a is an example of the second silicon carbide region. The second body region 26b is an example of the third silicon carbide region. The third body region 26c is an example of the sixth silicon carbide region. The source region 28 is an example of the fourth silicon carbide region. The body contact region 32 is an example of the fifth silicon carbide region.

The silicon carbide layer 10 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("P1" in FIG. 1) and a second face ("P2" in FIG. 1). Hereinafter, the first face P1 may be referred to as a surface, and the second face P2 may be referred to as a back surface. The first face P1 is disposed on the source electrode 12 side of the silicon carbide layer 10. In addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

As shown in FIG. 1, the MOSFET 100 includes a plurality of MOSFET regions and a plurality of SBD regions. A MOSFET is formed in each MOSFET region. An SBD is formed in each SBD region.

The MOSFET region extends in the first direction. The MOSFET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 100, the ratio between the MOSFET region and the SBD region is 2:1.

The ratio between the MOSFET region and the SBD region is not limited to 2:1. For example, the ratio may be 1:1 or 3:1, or any other ratio may be applied.

The $n^+$-type drain region 22 is provided on the back surface side of the silicon carbide layer 10. The drain region 22 contains, for example, nitrogen (N) as an n-type impurity. The n-type impurity concentration in the drain region 22 is, for example, equal to or more than $1 \times 10^{18}$ cm$^{-3}$ and equal to or less than $1 \times 10^{21}$ cm$^{-3}$.

The $n^-$-type drift region 24 is provided between the drain region 22 and the first face P1. The $n^-$-type drift region 24 is provided between the source electrode 12 and the drain electrode 14. The $n^-$-type drift region 24 is provided between the gate electrode 18 and the drain electrode 14.

The $n^-$-type drift region 24 is provided on the drain region 22. The drift region 24 contains, for example, nitrogen (N) as an n-type impurity. The n-type impurity concentration in the drift region 24 is lower than the n-type impurity concentration in the drain region 22. The n-type impurity concentration in the drift region 24 is, for example, equal to or more than $4 \times 10^{14}$ cm$^{-3}$ and equal to or less than $1 \times 10^{17}$ cm$^{-3}$. The thickness of the drift region 24 is, for example, equal to or more than 5 μm and equal to or less than 150 μm.

The $n^-$-type drift region 24 has the JFET region 24a, the JBS region 24b, and the lower region 24c.

The JFET region 24a is provided between the lower region 24c and the first face P1. The JFET region 24a is in contact with the first face P1. The JFET region 24a is provided between two adjacent body regions. For example, the JFET region 24a is provided between the first body region 26a and the second body region 26b.

The JFET region 24a extends in the first direction. The JFET region 24a faces the gate electrode 18 with the gate insulating layer 16 interposed therebetween.

The JFET region 24a functions as a current path for the MOSFET 100. The n-type impurity concentration in the JFET region 24a is higher than, for example, the n-type impurity concentration in the lower region 24c. The n-type impurity concentration in the JFET region 24a is, for example, equal to or more than $5 \times 10^{16}$ cm$^{-3}$ and equal to or less than $2 \times 10^{17}$ cm$^{-3}$.

The JBS region 24b is provided between the lower region 24c and the first face P1. The JBS region 24b is in contact with the first face P1. The JBS region 24b is provided between two adjacent body regions. For example, the JBS region 24b is provided between the first body region 26a and the third body region 26c.

The JBS region 24b extends in the first direction. The JBS region 24b is in contact with the source electrode 12.

The JBS region 24b functions as a cathode of the SBD. The n-type impurity concentration in the JBS region 24b is higher than, for example, the n-type impurity concentration in the lower region 24c. The n-type impurity concentration in the JBS region 24b is, for example, equal to or more than $5 \times 10^{16}$ cm$^{-3}$ and equal to or less than $2 \times 10^{17}$ cm$^{-3}$.

The ratio of the JFET region 24a to a predetermined region on the first face P1 is, for example, equal to or more than 5% and equal to or less than 20%. The ratio of the JBS region 24b to the predetermined region on the first face P1 is, for example, equal to or more than 2% and equal to or less than 10%.

For example, the ratio of the JFET region 24a to a predetermined region on the first face P1 is larger than the ratio of the JBS region 24b to the predetermined region on the first face P1. Here, the predetermined region is, for example, a region surrounded by a 100 μm×100 μm square on the first face P1.

The distance (d0 in FIG. 2) between the JFET region 24a and the JBS region 24b in the second direction is, for example, equal to or more than 1.0 μm and equal to or less than 5.0 μm. The first width (w1 in FIGS. 2 and 3) of the JFET region 24a in the second direction is equal to or more than 0.5 μm and equal to or less than 1.2 μm. In addition, the second width (w2 in FIGS. 2 and 3) of the JBS region 24b in the second direction is equal to or more than 0.5 μm and equal to or less than 1.5 μm.

The p-type body region 26 is provided between the drift region 24 and the first face P1. The body region 26 extends in the first direction. The body region 26 functions as a channel region of the MOSFET 100.

The body region 26 contains, for example, aluminum (Al) as a p-type impurity. The p-type impurity concentration in the body region 26 is, for example, equal to or more than $5 \times 10^{17}$ cm$^{-3}$ and equal to or less than $5 \times 10^{19}$ cm$^{-3}$.

The depth of the body region 26 is, for example, equal to or more than 0.5 μm and equal to or less than 1.0 μm.

The body region 26 is electrically connected to the source electrode 12. The electric potential of the body region 26 is fixed to the electric potential of the source electrode 12.

A part of the body region 26 is in contact with the first face P1. A part of the body region 26 faces the gate electrode 18. A part of the body region 26 becomes a channel region of the MOSFET 100. The gate insulating layer 16 is interposed between a part of the body region 26 and the gate electrode 18.

The first body region 26a and the second body region 26b are spaced from each other in the second direction. The first body region 26a and the second body region 26b are adjacent to each other in the second direction.

The first body region 26a and the third body region 26c are spaced from each other in the second direction. The first body region 26a and the third body region 26c are adjacent to each other in the second direction.

The third body region 26c and the fourth body region 26d are spaced from each other in the second direction. The third body region 26c and the fourth body region 26d are adjacent to each other in the second direction.

The JFET region 24a is provided between the first body region 26a and the second body region 26b. The JBS region 24b is provided between the second body region 26b and the third body region 26c. The first body region 26a is interposed between the JFET region 24a and the JBS region 24b.

The JFET region 24a is provided between the third body region 26c and the fourth body region 26d. The third body region 26c is interposed between the JBS region 24b and the JFET region 24a.

The $n^+$-type source region 28 is provided between the body region 26 and the first face P1. For example, the source region 28 is provided between the first body region 26a and the first face P1. The source region 28 extends in the first direction.

The source region 28 contains, for example, phosphorus (P) or nitrogen (N) as an n-type impurity. The n-type impurity concentration in the source region 28 is higher than the n-type impurity concentration in the drift region 24.

The n-type impurity concentration in the source region 28 is, for example, equal to or more than $1 \times 10^{19}$ cm$^{-3}$ and equal to or less than $1 \times 10^{21}$ cm$^{-3}$. The depth of the source region 28 is smaller than the depth of the body region 26. The depth of the source region 28 is, for example, equal to or more than 0.05 μm and equal to or less than 0.2 μm.

The source region 28 is in contact with the source electrode 12. The source region 28 is electrically connected to the source electrode 12. The contact between the source region 28 and the source electrode 12 is, for example, an ohmic contact. The electric potential of the source region 28 is fixed to the electric potential of the source electrode 12.

The $p^+$-type body contact region 32 is provided between the body region 26 and the first face P1. The body contact region 32 is provided between the body region 26 and the source electrode 12. The body contact region 32 extends in the first direction.

The p-type impurity concentration in the body contact region 32 is higher than the p-type impurity concentration in the body region 26.

The body contact region 32 contains, for example, aluminum (Al) as a p-type impurity. The p-type impurity concentration in the body contact region 32 is, for example, equal to or more than $1 \times 10^{19}$ cm$^{-3}$ and equal to or less than $1 \times 10^{21}$ cm$^{-3}$.

The depth of the body contact region 32 is, for example, equal to or more than 0.3 μm and equal to or less than 0.6 μm.

The body contact region 32 is in contact with the source electrode 12. The body contact region 32 is electrically connected to the source electrode 12. The contact between the body contact region 32 and the source electrode 12 is, for example, an ohmic contact. The electric potential of the body contact region 32 is fixed to the electric potential of the source electrode 12.

The gate electrode 18 is provided on the first face P1 side of the silicon carbide layer 10. The gate electrode 18 extends in the first direction. A plurality of gate electrodes 18 are arranged in parallel with each other in the second direction.

The gate electrode 18 is a conductive layer. The gate electrode 18 is, for example, polycrystalline silicon containing p-type impurities or n-type impurities.

The gate electrode 18 faces the body region 26. The gate electrode 18 faces the JFET region 24a.

The gate insulating layer 16 is provided between the gate electrode 18 and the body region 26. For example, the gate insulating layer 16 is provided between the gate electrode 18 and the first body region 26a, between the gate electrode 18 and the second body region 26b, between the gate electrode 18 and the third body region 26c, and between the gate electrode 18 and the fourth body region 26d. The gate insulating layer 16 is provided between the gate electrode 18 and the JFET region 24a. The gate insulating layer 16 is provided between the gate electrode 18 and the source region 28.

The gate insulating layer 16 is, for example, silicon oxide. For example, a high-k insulating material (insulating material with a high dielectric constant) can be applied to the gate insulating layer 16.

The interlayer insulating layer 20 is provided on the gate electrode 18 and the silicon carbide layer 10. The interlayer insulating layer 20 is, for example, silicon oxide.

The source electrode 12 is in contact with the silicon carbide layer 10. The source electrode 12 is in contact with the source region 28. The source electrode 12 is in contact with the body contact region 32. The source electrode 12 is in contact with the JBS region 24b.

The source electrode 12 has, for example, a silicide layer 12a and a metal layer 12b. The silicide layer 12a is provided between the silicon carbide layer 10 and the metal layer 12b. The silicide layer 12a extends in the first direction.

The silicide layer 12a is in contact with the source region 28. The silicide layer 12a is in contact with the body contact region 32.

The source electrode 12 functions as an anode of the SBD.

The silicide layer 12a of the source electrode 12 contains silicide. The silicide layer 12a is, for example, nickel silicide or titanium silicide.

The contact between the source electrode 12 and the source region 28 becomes an ohmic contact by providing the silicide layer 12a. The contact between the source electrode 12 and the body contact region 32 becomes an ohmic contact by providing the silicide layer 12a.

The metal layer 12b of the source electrode 12 contains metal. The metal layer 12b has, for example, a stacked structure of titanium (Ti) and aluminum (Al).

The first interface (I1 in FIG. 2) between the source electrode 12 and the body contact region 32 is deeper than, for example, the second interface (I2 in FIG. 2) between the source electrode 12 and the JBS region 24b. The difference (d1 in FIG. 2) in depth between the first interface I1 and the second interface I2 is, for example, equal to or more than 0.1 μm and equal to or less than 0.3 μm. The depth of the first interface I1 is, for example, larger than the depth of the third interface (I3 in FIG. 2) between the source region 28 and the body contact region 32.

The distance (d2 in FIG. 2) between the first interface I1 and the JBS region 24b in the second direction is, for example, equal to or more than 0.5 μm and equal to or less than 2.0 μm.

The drain electrode 14 is provided on the back surface of the silicon carbide layer 10. The drain electrode 14 is in contact with the drain region 22.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

When the MOSFET 100 is in the on state, a current flows from the drain electrode 14 to the source electrode 12 through channels formed in the drain region 22, the lower region 24c, the JFET region 24a, and the body region 26 and the source region 28.

When a forward bias is applied to the SBD region, a current flows from the source electrode 12 to the drain electrode 14 through the JBS region 24b, the lower region 24c, and the drain region 22.

As shown in FIG. 3, on the first face P1, an arbitrary midpoint of the JFET region 24a in the second direction is defined as a first midpoint MP1. A center line extending in the first direction through the first midpoint MP1 is defined as a first center line ML1. On the first center line ML1, a line segment disposed in the second direction with respect to a portion where the source region 28 and the source electrode 12 are in contact with each other is defined as a first line segment LS1.

In the MOSFET 100, the portion where the source region 28 and the source electrode 12 are in contact with each other matches the boundary between the source region 28 and the silicide layer 12a in FIG. 3.

As shown in FIG. 3, on the first face P1, an arbitrary midpoint of the JBS region 24b in the second direction is defined as a second midpoint MP2. A center line extending in the first direction through the second midpoint MP2 is defined as a second center line ML2. A line segment overlapping the JBS region 24b on the second center line ML2 is defined as a second line segment LS2.

The shortest distance (dmin in FIG. 3) between the first line segment LS1 and the second line segment LS2 is equal to or more than three times the first width w1 of the JFET region 24a in the second direction.

Next, the function and effect of the MOSFET 100 of the first embodiment will be described.

Figure 4:
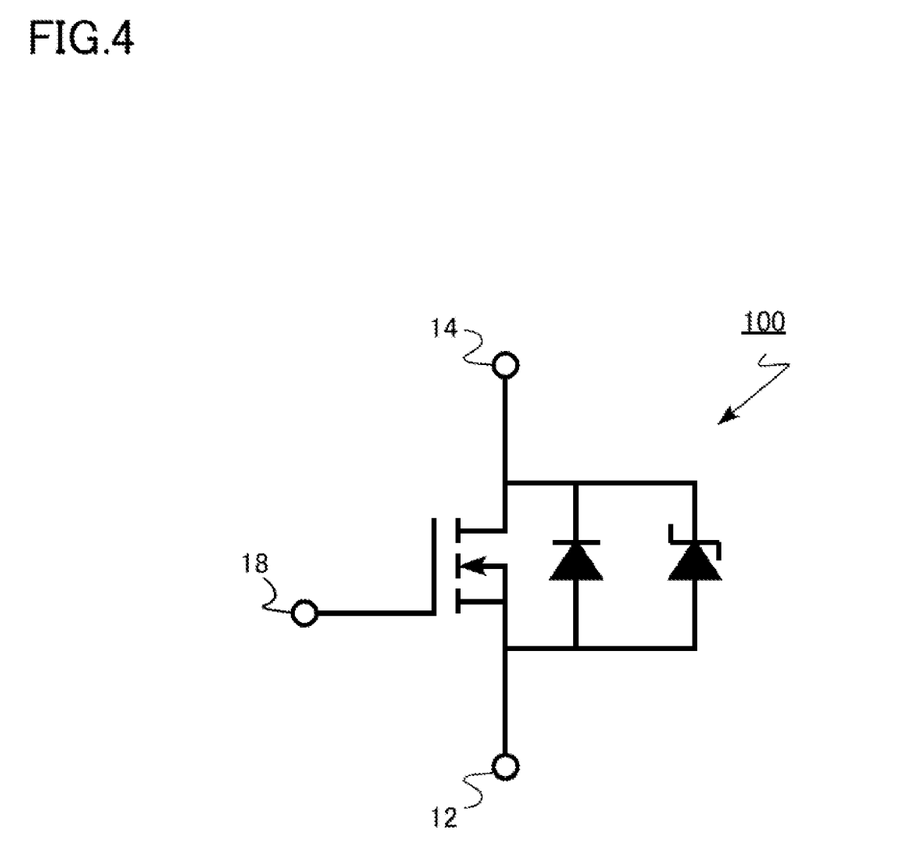
FIG. 4 is an equivalent circuit diagram of the semiconductor device of the first embodiment.

FIG. 4 is an equivalent circuit diagram of the semiconductor device of the first embodiment. In the MOSFET 100, between the source electrode 12 and the drain electrode 14, a pn diode and an SBD are connected as built-in diodes in parallel with a transistor. The body region 26 is the anode of the pn junction diode, and the drift region 24 is the cathode of the pn junction diode. In addition, the source electrode 12 is the anode of the SBD, and the JBS region 24b is the cathode of the SBD.

For example, a case where the MOSFET 100 is used as a switching element connected to an inductive load is considered. When the MOSFET 100 is turned off, a voltage that is positive with respect to the drain electrode 14 may be applied to the source electrode 12 due to an induced current caused by the inductive load. In this case, a forward current flows through the built-in diode. This state is also referred to as a reverse conduction state.

If the MOSFET does not include an SBD, a forward current flows through the pn junction diode. The pn junction diode operates in a bipolar manner. When a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a decrease in the reliability of the MOSFET.

The MOSFET 100 includes an SBD. A forward voltage (Vf) at which a forward current starts to flow through the SBD is lower than a forward voltage (Vf) of the pn junction diode. Therefore, a forward current flows through the SBD prior to the pn junction diode.

The forward voltage (Vf) of the SBD is, for example, equal to or more than 1.0 V and less than 2.0 V. The forward voltage (Vf) of the pn junction diode is, for example, equal to or more than 2.0 V and equal to or less than 3.0 V.

The SBD operates in a unipolar manner. Therefore, even if a forward current flows, no stacking fault grows in the silicon carbide layer 10 due to the recombination energy of the carriers. Therefore, the increase in the on-resistance of the MOSFET 100 is suppressed. As a result, the reliability of the MOSFET 100 is improved.

When the MOSFET is in the on state, the load connected to the MOSFET may fail and the load resistance may decrease. In this case, the MOSFET is short-circuited and a large current flows through the MOSFET. The time from when the MOSFET is short-circuited to when the MOSFET is damaged is referred to as short-circuit tolerance. When the short-circuit tolerance decreases, the reliability of the MOSFET decreases.

The inventor's study has revealed that, in a MOSFET including an SBD, a decrease in short-circuit tolerance due to the SBD can occur. In particular, it has been clarified that, when the distance between the MOSFET region and the SBD region decreases, the short-circuit tolerance tends to decrease.

In the MOSFET 100, the first width w1 of the JFET region 24a in the second direction is equal to or more than 0.5 μm and equal to or less than 1.2 μm. Since the first width w1 is equal to or more than 0.5 μm, the on-resistance of the MOSFET 100 is reduced. Since the first width w1 is equal to or less than 1.2 μm, the MOSFET 100 can be scaled down. In addition, since the first width w1 is equal to or less than 1.2 μm, the current flowing through the JFET region 24a is limited when the MOSFET 100 is short-circuited, so that the short-circuit tolerance of the MOSFET 100 is improved.

In the MOSFET 100, the second width w2 of the JBS region 24b in the second direction is equal to or more than 0.5 μm and equal to or less than 1.5 μm. Since the second width w2 is equal to or more than 0.5 μm, the forward current of the SBD increases. In addition, since the second width w2 is equal to or less than 1.5 μm, the MOSFET 100 can be scaled down. In addition, since the second width w2 is equal to or less than 1.5 μm, the JBS effect is promoted, and the leakage current at the time of reverse bias of the SBD is reduced.

In a MOSFET including an SBD, the cause of the decrease in short-circuit tolerance due to the SBD is estimated as follows. When the MOSFET is short-circuited, a large current flows through the MOSFET region, so that the temperature of the MOSFET region rises. The heat generated in the MOSFET region is transferred to the SBD region, so that the temperature of the SBD region rises. As the temperature of the SBD region rises, the leakage current of the SBD in the reverse bias state increases. As the leakage current of the SBD rises, the SBD region generates heat, so that the temperature of the SBD region further rises.

It is considered that positive feedback occurs between the temperature rise in the SBD region and the leakage current of the SBD, and finally, the MOSFET is damaged by the temperature rise in the SBD region. Damage to the MOSFET due to the temperature rise in the SBD region reduces the short-circuit tolerance.

In the MOSFET 100, the shortest distance (dmin in FIG. 3) between the first line segment LS1 and the second line segment LS2 is equal to or more than three times the first width w1 of the JFET region 24a in the second direction. That is, the distance between the JBS region 24b and a portion of the JFET region 24a where the amount of heat generated is particularly large when the MOSFET 100 is short-circuited is set to be equal to or more than three times the first width w1 of the JFET region 24a.

By setting the shortest distance dmin to be equal to or more than three times the first width w1, it is possible to suppress the positive feedback between the temperature rise in the SBD region and the leakage current of the SBD. Therefore, the short-circuit tolerance of the MOSFET 100 is improved.

The amount of heat generated in the JFET region 24a depends on the first width w1 of the JFET region 24a. Qualitatively, as the first width w1 increases, the amount of current that flows during a short circuit increases, so that the amount of heat generated increases. By setting the shortest distance dmin to be equal to or more than three times the first width w1, the transfer of heat in the MOSFET region to the SBD region is sufficiently suppressed. Therefore, it is considered that the positive feedback between the temperature rise in the SBD region and the leakage current of the SBD can be suppressed.

From the viewpoint of improving the short-circuit tolerance of the MOSFET 100, the shortest distance dmin is preferably equal to or more than 3.2 times, more preferably equal to or more than 3.5 times the first width w1.

The ratio of the JFET region 24a to a predetermined region on the first face P1 is preferably equal to or more than 5% and equal to or less than 20%. Since the ratio of the JFET region 24a is equal to or more than 5%, the on-resistance of the MOSFET 100 can be reduced. Since the ratio of the JFET region 24a is equal to or less than 20%, the amount of heat generated in the MOSFET region of the MOSFET 100 is suppressed, so that the short-circuit tolerance is improved.

The ratio of the JBS region 24b to the predetermined region on the first face P1 is preferably equal to or more than 2% and equal to or less than 10%. By setting the ratio of the JBS region 24b to be equal to or more than 2%, the forward current of the SBD increases. By setting the ratio of the JBS region 24b to be equal to or less than 10%, the amount of heat generated in the SBD region of the MOSFET 100 is suppressed, so that the short-circuit tolerance is improved.

The ratio of the JFET region 24a to a predetermined region on the first face P1 is preferably larger than the ratio of the JBS region 24b to the predetermined region on the first face P1. The amount of heat generated in the SBD region is suppressed, so that the short-circuit tolerance is improved.

It is preferable that the first interface (I1 in FIG. 2) between the source electrode 12 and the body contact region 32 is deeper than the second interface (I2 in FIG. 2) between the source electrode 12 and the JBS region 24b. Since the source electrode 12 is present at a deep position of the silicon carbide layer 10 near the JBS region 24b, an increase in current with respect to the SBD region is suppressed during the short-circuit operation. Therefore, the short-circuit tolerance is improved.

From the viewpoint of suppressing heat generation in the SBD region, the difference (d1 in FIG. 2) in depth between the first interface I1 and the second interface I2 is preferably equal to or more than 0.1 μm, more preferably equal to or more than 0.15 μm.

The depth of the first interface I1 is preferably larger than the depth of the third interface (I3 in FIG. 2) between the source region 28 and the body contact region 32. Since the source electrode 12 is present at a deep position of the silicon carbide layer 10 near the JBS region 24b, an increase in current with respect to the SBD region is suppressed during the short-circuit operation. Therefore, the short-circuit tolerance is improved.

The distance (d2 in FIG. 2) between the first interface I1 and the JBS region 24b in the second direction is preferably equal to or less than 2.0 μm, more preferably equal to or less than 1.5 μm, and even more preferably equal to or less than 1.0 μm. Since the source electrode 12 is present at a position close to the JBS region 24b, an increase in current with respect to the SBD region is suppressed during the short-circuit operation. Therefore, the short-circuit tolerance is improved.

Figure 5:
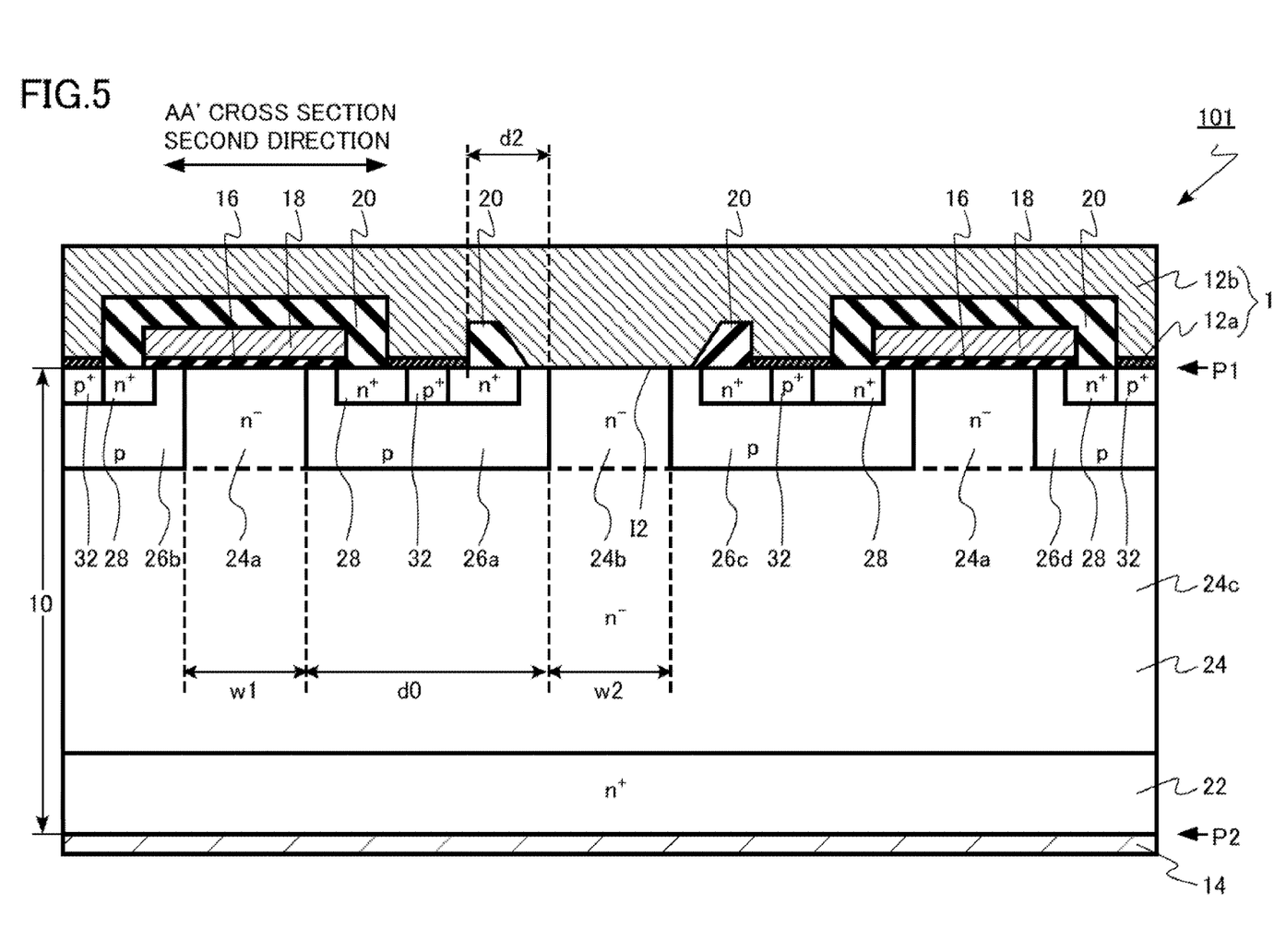
FIG. 5 is a schematic cross-sectional view of a modification example of the semiconductor device of the first embodiment.

FIG. 5 is a schematic cross-sectional view of a modification example of the semiconductor device of the first embodiment. FIG. 5 is a diagram corresponding to FIG. 2 of the first embodiment.

A MOSFET 101 of the modification example is different from the MOSFET 100 of the first embodiment in that the depth of the interface between the source electrode 12 and the body contact region 32 is approximately the same as the depth of the interface between the source electrode 12 and the JBS region 24b.

As described above, according to the first embodiment and its modification example, a MOSFET is realized in which a decrease in short-circuit tolerance due to the SBD is suppressed and the short-circuit tolerance is improved.

Second Embodiment

A semiconductor device of a second embodiment is different from the semiconductor device of the first embodiment in that the second region is disposed in the first direction of the fifth silicon carbide region. Hereinafter, the description of a part of the content overlapping the first embodiment may be omitted.

Figure 6:
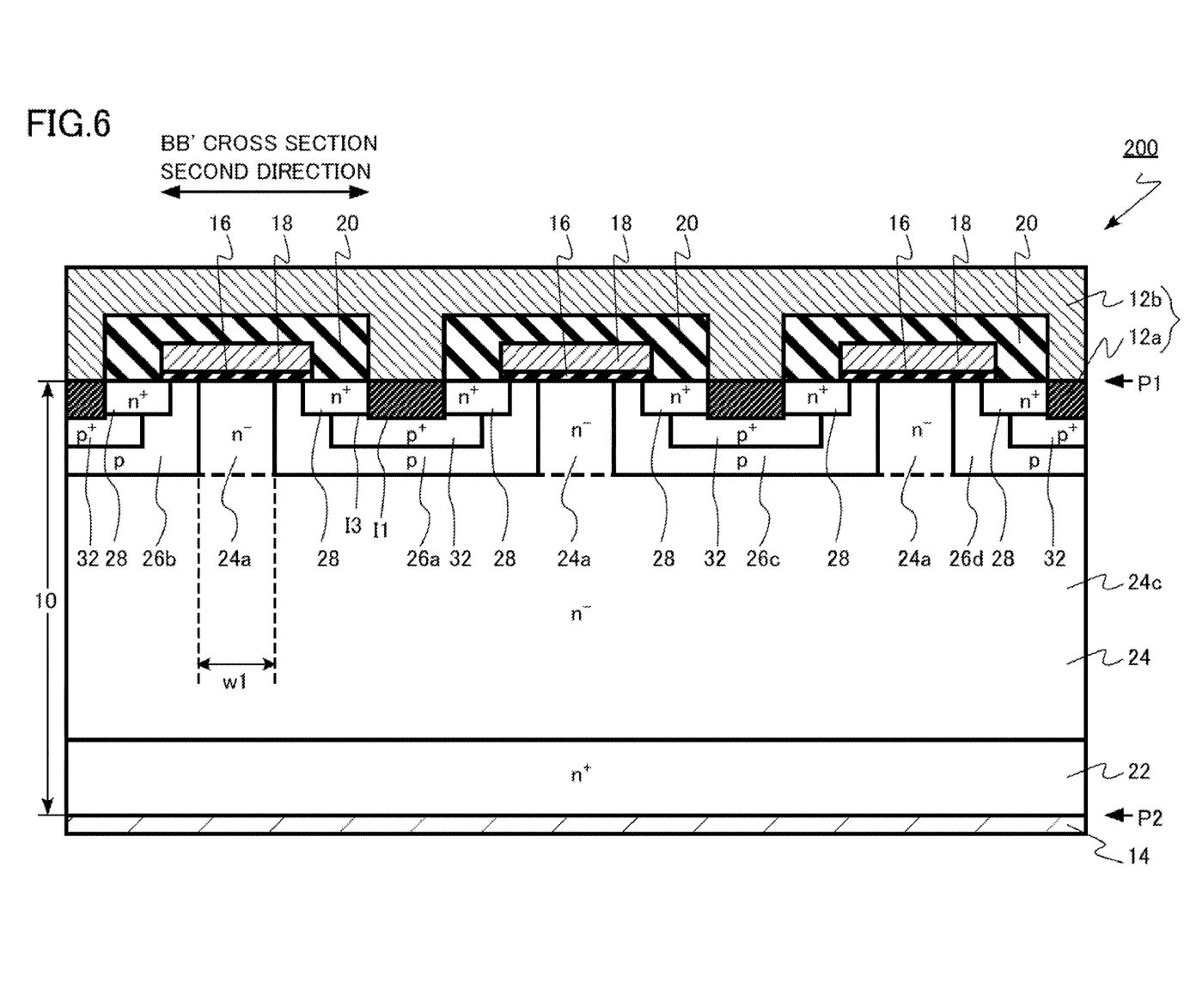
FIG. 6 is a schematic cross-sectional view of a semiconductor device of a second embodiment.
Figure 7:
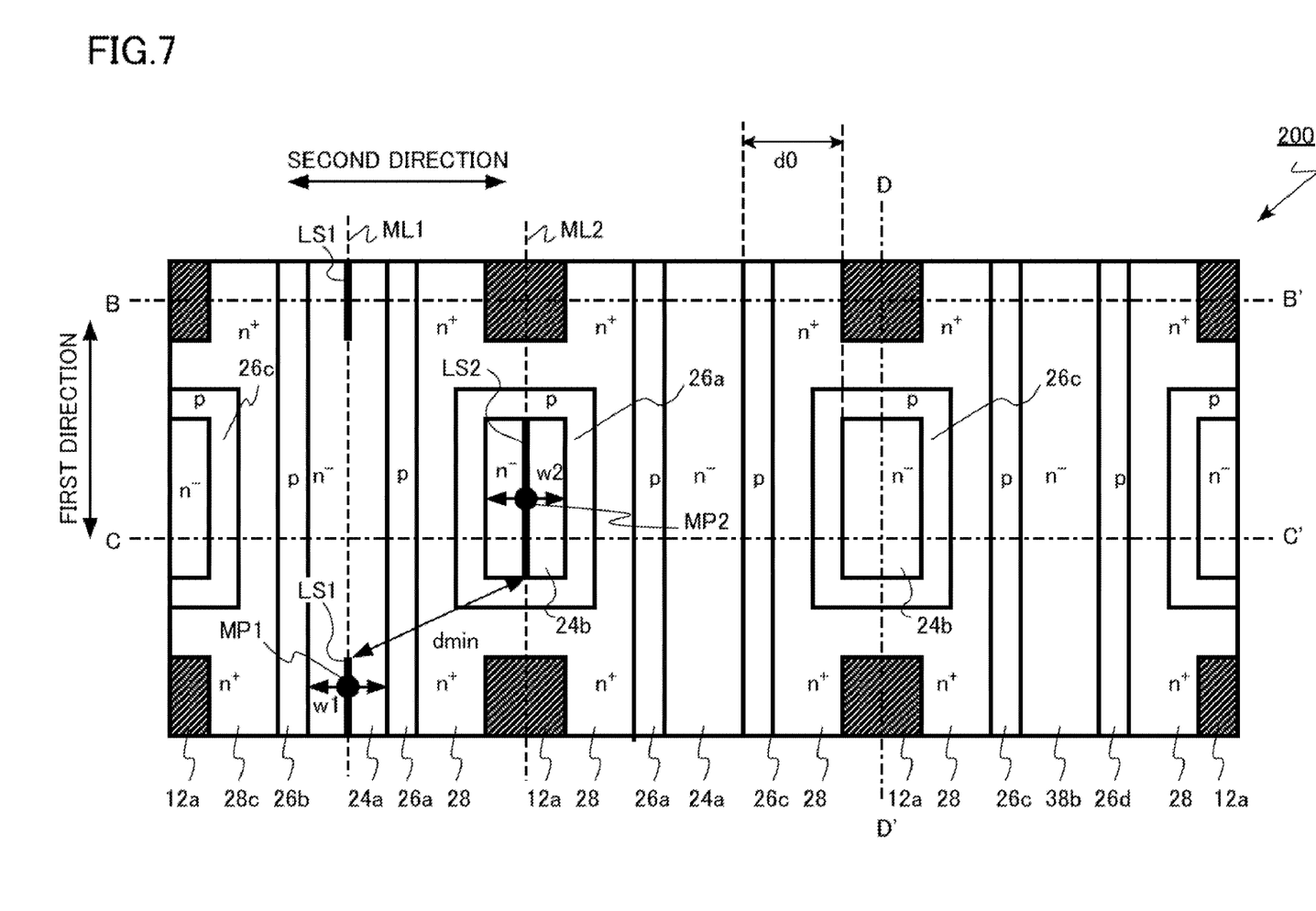
FIG. 7 is a schematic top view of the semiconductor device of the second embodiment.
Figure 8:
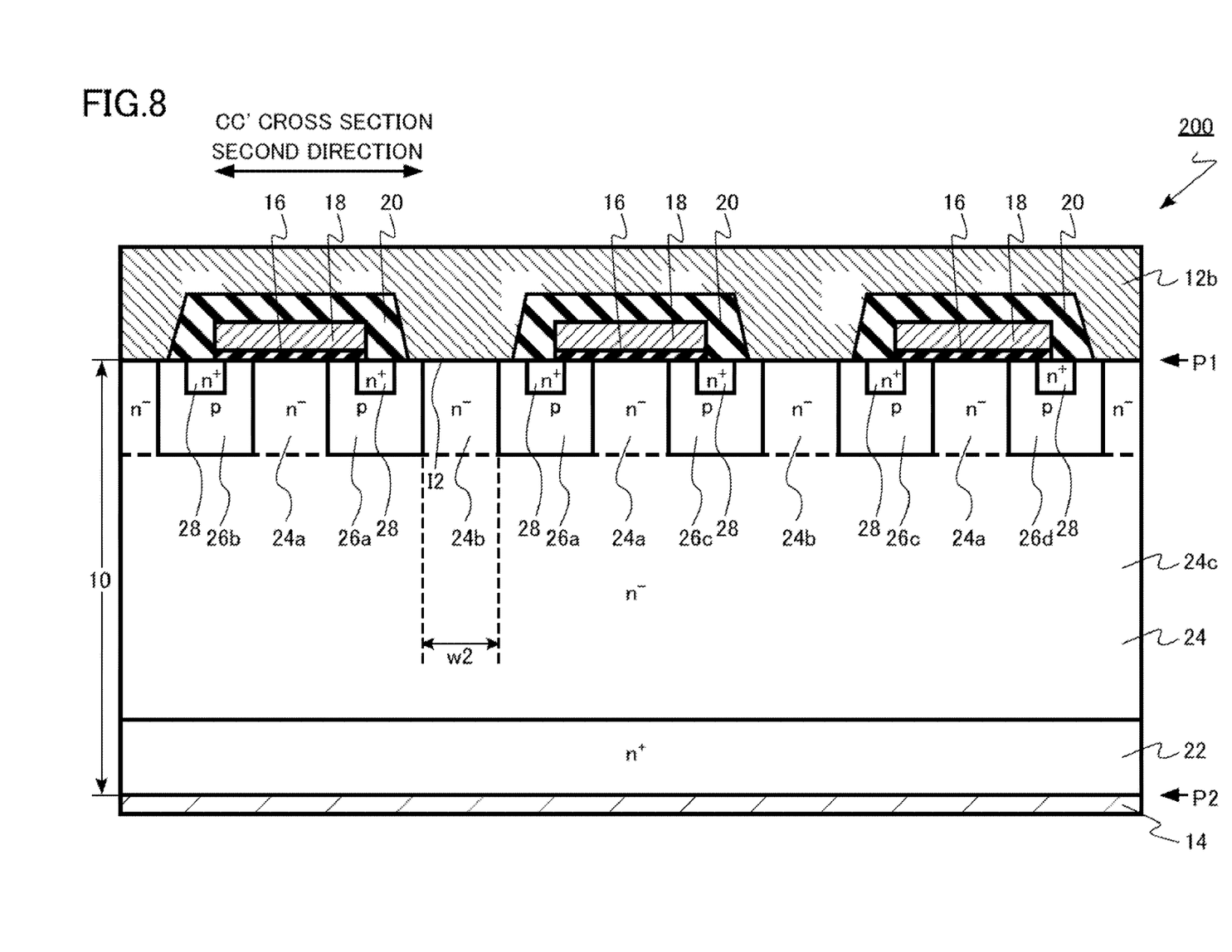
FIG. 8 is a schematic cross-sectional view of the semiconductor device of the second embodiment.
Figure 9:
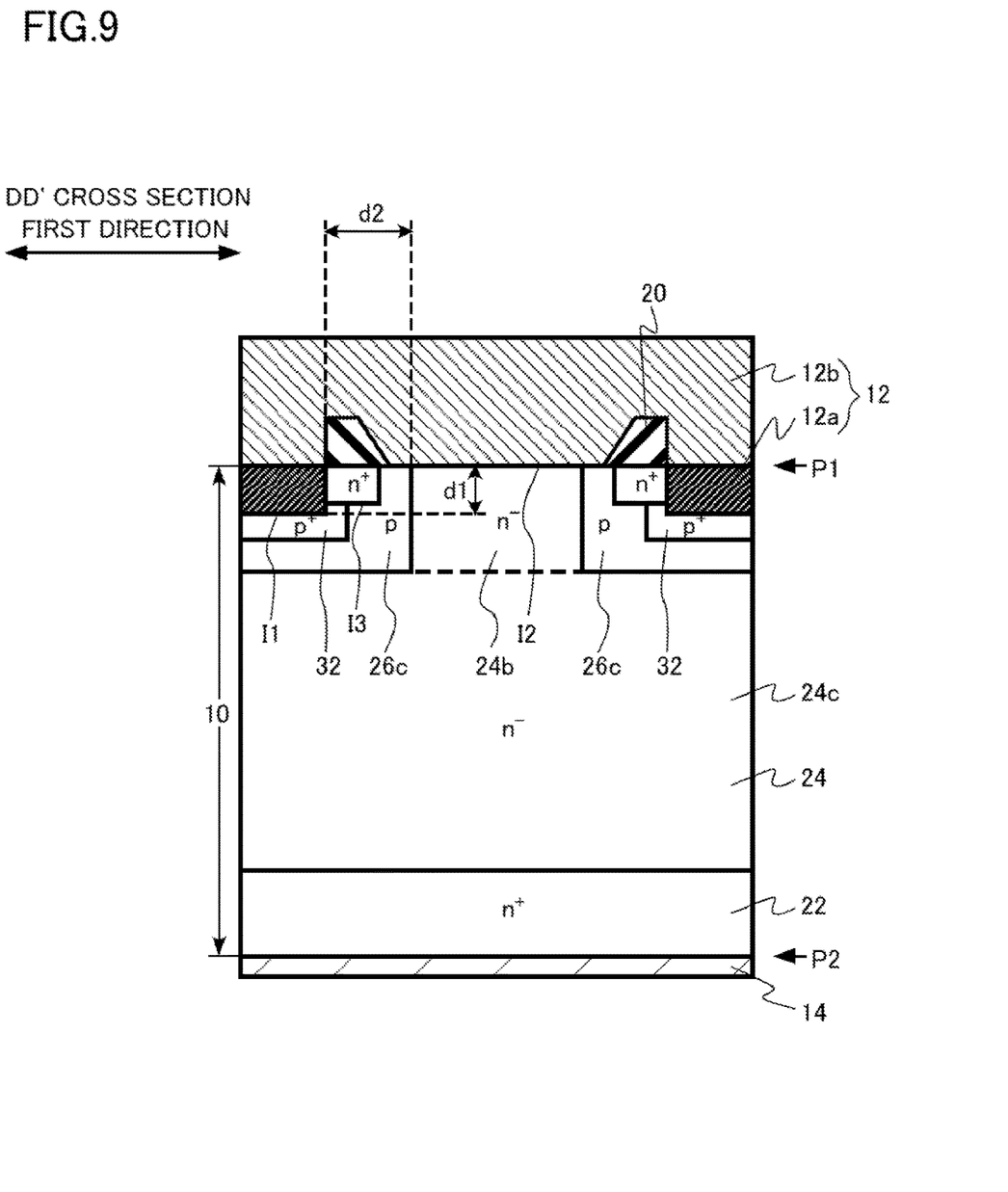
FIG. 9 is a schematic cross-sectional view of the semiconductor device of the second embodiment.

FIG. 6 is a schematic cross-sectional view of the semiconductor device of the second embodiment. FIG. 7 is a schematic top view of the semiconductor device of the second embodiment. FIGS. 8 and 9 are schematic cross-sectional views of the semiconductor device of the second embodiment. FIG. 7 is a diagram showing a silicon carbide region and a pattern of electrodes on the surface of a silicon carbide layer. FIG. 6 is a cross-sectional view taken along the line BB' of FIG. 7. FIG. 8 is a cross-sectional view taken along the line CC' of FIG. 7. FIG. 9 is a cross-sectional view taken along the line DD' of FIG. 7.

The semiconductor device of the second embodiment is a planar gate type vertical MOSFET 200 using silicon carbide. The MOSFET 200 of the second embodiment is, for example, a DIMOSFET. In addition, the semiconductor device of the second embodiment includes an SBD as a built-in diode. The MOSFET 200 of the second embodiment is different from the MOSFET 100 of the first embodiment in terms of the arrangement pattern of the MOSFET region and the SBD region.

Hereinafter, a case where the first conductive type is n type and the second conductive type is p type will be described as an example. The MOSFET 200 is a vertical re-channel MOSFET having electrons as carriers.

The MOSFET 200 includes a silicon carbide layer 10, a source electrode 12 (first electrode), a drain electrode 14 (second electrode), a gate insulating layer 16, a gate electrode 18, and an interlayer insulating layer 20. The MOSFET 200 includes a plurality of MOSFET regions and a plurality of SBD regions.

The silicon carbide layer 10 includes an $n^+$-type drain region 22, an $n^-$-type drift region 24 (first silicon carbide region), a p-type body region 26, an $n^+$-type source region 28 (fourth silicon carbide region), and a $p^+$-type body contact region 32 (fifth silicon carbide region). The p-type body region 26 includes a first body region of p-type 26a (second silicon carbide region), a second body region of p-type 26b (third silicon carbide region), a third body region of p-type 26c, and a fourth body region of p-type 26d.

The drift region 24 has a JFET region 24a (first region), a JBS region 24b (second region), and a lower region 24c.

The source electrode 12 is an example of the first electrode. The drain electrode 14 is an example of the second electrode. The drift region 24 is an example of the first silicon carbide region. The first body region 26a is an example of the second silicon carbide region. The second body region 26b is an example of the third silicon carbide region. The source region 28 is an example of the fourth silicon carbide region. The body contact region 32 is an example of the fifth silicon carbide region.

In the MOSFET 200, the JBS region 24b is provided in the first direction of the body contact region 32. The JBS region 24b is disposed between two body contact regions 32 that are provided so as to be spaced from each other in the first direction.

The JBS region 24b is surrounded by the body region 26. The JBS region 24b is surrounded by, for example, the first body region 26a. The JBS region 24b is surrounded by, for example, the third body region 26c.

At least a part of the body region 26 is interposed between the JFET region 24a and the JBS region 24b.

The ratio of the JFET region 24a to a predetermined region on the first face P1 is, for example, equal to or more than 5% and equal to or less than 20%. The ratio of the JBS region 24b to the predetermined region on the first face P1 is, for example, equal to or more than 2% and equal to or less than 10%.

The ratio of the JFET region 24a to the predetermined region on the first face P1 is larger than the ratio of the JBS region 24b to the predetermined region on the first face P1, for example. Here, the predetermined region is, for example, a region surrounded by a 100 µm×100 µm square on the first face P1.

The distance (d0 in FIG. 7) between the JFET region 24a and the JBS region 24b in the second direction is, for example, equal to or more than 1.0 µm and equal to or less than 5.0 µm. The first width (w1 in FIGS. 6 and 7) of the JFET region 24a in the second direction is equal to or more than 0.5 µm and equal to or less than 1.2 µm. In addition, the second width (w2 in FIGS. 7 and 8) of the JBS region 24b in the second direction is equal to or more than 0.5 µm and equal to or less than 1.5 µm.

The first interface (I1 in FIGS. 6 and 9) between the source electrode 12 and the body contact region 32 is deeper than the second interface (I2 in FIGS. 8 and 9) between the source electrode 12 and the SBD region. The difference (d1 in FIG. 9) in depth between the first interface I1 and the second interface I2 is, for example, equal to or more than 0.1 µm and equal to or less than 0.3 µm. The depth of the first interface I1 is, larger than the depth of the third interface (I3 in FIGS. 6 and 9) between the source region 28 and the body contact region 32.

The distance (d2 in FIG. 9) between the first interface I1 and the JBS region 24b in the first direction is, for example, equal to or more than 0.5 µm and equal to or less than 2.0 µm.

As shown in FIG. 7, on the first face P1, an arbitrary midpoint of the JFET region 24a in the second direction is defined as a first midpoint MP1. A center line extending in the first direction through the first midpoint MP1 is defined as a first center line ML1. On the first center line ML1, a line segment disposed in the second direction with respect to a portion where the source region 28 and the source electrode 12 are in contact with each other is defined as a first line segment LS1.

In the MOSFET 200, the portion where the source region 28 and the source electrode 12 are in contact with each other matches the boundary between the source region 28 and the silicide layer 12a in FIG. 7.

As shown in FIG. 7, on the first face P1, an arbitrary midpoint of the JBS region 24b in the second direction is defined as a second midpoint MP2. A center line extending in the first direction through the second midpoint MP2 is defined as a second center line ML2. A line segment overlapping the JBS region 24b on the second center line ML2 is defined as a second line segment LS2.

The shortest distance (dmin in FIG. 7) between the first line segment LS1 and the second line segment LS2 is equal to or more than three times the first width w1 of the JFET region 24a in the second direction.

Next, the function and effect of the MOSFET 200 of the second embodiment will be described.

The MOSFET 200 includes an SBD. Therefore, as in the MOSFET 100 of the first embodiment, the increase in the on-resistance is suppressed. As a result, the reliability of the MOSFET 200 is improved.

In the MOSFET 200, the JBS region 24b is arranged between two body contact regions 32 that are provided so as to be spaced from each other in the first direction. With this arrangement, for example, the MOSFET 200 can be scaled down as compared with the MOSFET 100 of the first embodiment.

In the MOSFET 200, the first width w1 of the JFET region 24a in the second direction is equal to or more than 0.5 µm and equal to or less than 1.2 µm. Since the first width w1 is equal to or more than 0.5 µm, the on-resistance of the MOSFET 200 is reduced. Since the first width w1 is equal to or less than 1.2 µm, the MOSFET 200 can be scaled down. In addition, since the first width w1 is equal to or less than 1.2 µm, the current flowing through the JFET region 24a is limited when the MOSFET 200 is short-circuited, so that the short-circuit tolerance of the MOSFET 200 is improved.

In the MOSFET 200, the second width w2 of the JBS region 24b in the second direction is equal to or more than 0.5 µm and equal to or less than 1.5 µm. Since the second width w2 is equal to or more than 0.5 µm, the forward current of the SBD increases. In addition, since the second width w2 is equal to or less than 1.5 µm, the MOSFET 200 can be scaled down. In addition, since the second width w2 is equal to or less than 1.5 µm, the JBS effect is promoted, and the leakage current at the time of reverse bias of the SBD is reduced.

In the MOSFET 200, the shortest distance (dmin in FIG. 7) between the first line segment LS1 and the second line segment LS2 is equal to or more than three times the first width w1 of the JFET region 24a in the second direction. That is, the distance between the JBS region 24b and a portion of the JFET region 24a where the amount of heat generated is particularly large when the MOSFET 200 is short-circuited is set to be equal to or more than three times the first width w1 of the JFET region 24a. It is considered that, when the MOSFET 200 is short-circuited, a large current flows through a portion of the JFET region 24a near a portion where the source region 28 and the source electrode 12 are in contact with each other, so that heat generation is particularly large.

By setting the shortest distance dmin to be equal to or more than three times the first width w1, it is possible to suppress the positive feedback between the temperature rise in the SBD region and the leakage current of the SBD. Therefore, the short-circuit tolerance of the MOSFET 200 is improved.

From the viewpoint of improving the short-circuit tolerance of the MOSFET 200, the shortest distance dmin is preferably equal to or more than 3.2 times, more preferably equal to or more than 3.5 times the first width w1.

The ratio of the JFET region 24a to a predetermined region on the first face P1 is preferably equal to or more than 5% and equal to or less than 20%. Since the ratio of the JFET region 24a is equal to or more than 5%, the on-resistance of the MOSFET 200 can be reduced. Since the ratio of the JFET region 24a is equal to or less than 20%, the amount of heat generated in the MOSFET region of the MOSFET 200 is suppressed, so that the short-circuit tolerance is improved.

The ratio of the JBS region 24b to the predetermined region on the first face P1 is preferably equal to or more than 2% and equal to or less than 10%. By setting the ratio of the JBS region 24b to be equal to or more than 2%, the forward current of the SBD increases. By setting the ratio of the JBS region 24b to be equal to or less than 10%, the amount of heat generated in the SBD region of the MOSFET 200 is suppressed, so that the short-circuit tolerance is improved.

The ratio of the JFET region 24a to the predetermined region on the first face P1 is preferably larger than the ratio of the JBS region 24b to the predetermined region on the first face P1. The amount of heat generated in the SBD region is suppressed, so that the short-circuit tolerance is improved.

It is preferable that the first interface (I1 in FIG. 6) between the source electrode 12 and the body contact region 32 is larger than the second interface (I2 in FIGS. 8 and 9) between the source electrode 12 and the SBD region. Since the source electrode 12 is present at a deep position of the silicon carbide layer 10 near the JBS region 24b, an increase in current with respect to the SBD region is suppressed during the short-circuit operation. Therefore, the short-circuit tolerance is improved.

From the viewpoint of suppressing heat generation in the SBD region, the difference (d1 in FIG. 9) in depth between the first interface I1 and the second interface I2 is preferably equal to or more than 0.1 µm, more preferably equal to or more than 0.15 µm.

The depth of the first interface I1 is preferably larger than the depth of the third interface (I3 in FIG. 6) between the source region 28 and the body contact region 32. Since the source electrode 12 is present at a deep position of the silicon carbide layer 10 near the JBS region 24b, an increase in current with respect to the SBD region is suppressed during the short-circuit operation. Therefore, the short-circuit tolerance is improved.

The distance (d2 in FIG. 9) between the first interface I1 and the JBS region 24b in the second direction is preferably equal to or less than 2.0 µm, more preferably equal to or less than 1.5 µm, and even more preferably equal to or less than 1.0 µm. Since the source electrode 12 is present at a position close to the JBS region 24b, an increase in current with respect to the SBD region is suppressed during the short-circuit operation. Therefore, the short-circuit tolerance is improved.

As described above, according to the second embodiment, a MOSFET is realized in which a decrease in short-circuit tolerance due to the SBD is suppressed and the short-circuit tolerance is improved.

In the first and second embodiments, the case of 4H—SiC has been described as an example of the crystal structure of SiC. However, the embodiments can also be applied to devices using SiC having other crystal structures, such as 6H—SiC and 3C—SiC. In addition, a face other than the (0001) face can also be applied as the surface of the silicon carbide layer 10.

In the first and second embodiments, the case where the first conductive type is n type and the second conductive type is p type has been described as an example. However, the first conductive type can be p type and the second conductive type can also be n type.

In the first and second embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first electrode;
    a second electrode;
    a gate electrode extending in a first direction;
    a silicon carbide layer provided between the first electrode and the second electrode and having a first face parallel to the first direction on a side of the first electrode and a second face on a side of the second electrode, the silicon carbide layer including:
        a first silicon carbide region of a first conductive type including a first region and a second region, the first region being in contact with the first face, the first region facing the gate electrode, the first region extending in the first direction, the second region being in contact with the first face and in contact with the first electrode;
        a second silicon carbide region of a second conductive type provided between the first silicon carbide region and the first face, the second silicon carbide region facing the gate electrode, and electrically connected to the first electrode, at least a part of the second silicon carbide region being interposed between the first region and the second region;
        a third silicon carbide region of the second conductive type provided between the first silicon carbide region and the first face, the third silicon carbide region facing the gate electrode, and electrically connected to the first electrode, the first region being interposed between the second silicon carbide region and the third silicon carbide region; and a fourth silicon carbide region of the first conductive type provided between the second silicon carbide region and the first face and electrically connected to the first electrode; and a gate insulating layer provided between the gate electrode and the second silicon carbide region, between the gate electrode and the third silicon carbide region, and between the gate electrode and the first region, wherein a first width of the first region in a second direction perpendicular to the first direction is equal to or more than 0.5 µm and equal to or less than 1.2 µm, a second width of the second region in the second direction is equal to or more than 0.5 µm and equal to or less than 1.5 µm, and a shortest distance between a first line segment and a second line segment is equal to or more than three times the first width, the first line segment being on a first center line extending in the first direction through a first midpoint of the first region in the second direction on the first face, the first line segment being disposed in the second direction with respect to a portion where the fourth silicon carbide region and the first electrode are in contact with each other, the second line segment being on a second center line extending in the first direction through a second midpoint of the second region in the second direction on the first face, the second line segment overlapping the second region.

2. The semiconductor device according to claim 1, wherein a ratio of the first region to a predetermined region on the first face is equal to or less than 20%, and a ratio of the second region to the predetermined region on the first face is equal to or less than 10%.

3. The semiconductor device according to claim 1, wherein the silicon carbide layer further includes a fifth silicon carbide region of the second conductive type provided between the first electrode and the second silicon carbide region and having a higher second conductive type impurity concentration than the second silicon carbide region.

4. The semiconductor device according to claim 1, wherein the silicon carbide layer further includes a sixth silicon carbide region of the second conductive type provided between the first silicon carbide region and the first face, the sixth silicon carbide region facing the gate electrode, and electrically connected to the first electrode, the second region being interposed between the second silicon carbide region and the sixth silicon carbide region.

5. The semiconductor device according to claim 3, wherein the second region is disposed in the first direction of the fifth silicon carbide region.

6. The semiconductor device according to claim 3, wherein a first interface between the first electrode and the fifth silicon carbide region is deeper than a second interface between the first electrode and the second region.

7. The semiconductor device according to claim 6, wherein a difference in depth between the first interface and the second interface is equal to or more than 0.1 µm.

8. The semiconductor device according to claim 6, wherein a distance between the first interface and the second region is equal to or less than 0.5 µm.

9. The semiconductor device according to claim 3, wherein a first interface between the first electrode and the fifth silicon carbide region is deeper than a third interface between the fourth silicon carbide region and the fifth silicon carbide region.

\* \* \* \* \*